United States Patent [19]

Sutton et al.

[11] Patent Number: 4,541,100
[45] Date of Patent: Sep. 10, 1985

[54] APPARATUS INCLUDING A PROGRAMMABLE SET-UP AND HOLD FEATURE

[75] Inventors: Steven R. Sutton, Beaverton, Oreg.; Michael S. Hagen, Vancouver, Wash.; David D. Chapman, Portland, Oreg.; Glenn S. Gombert, Hillsboro, Oreg.; Steven R. Palmquist, Beaverton, Oreg.

[73] Assignee: Tektronix, Inc., Beaverton, Oreg.

[21] Appl. No.: 399,938

[22] Filed: Jul. 19, 1982

Related U.S. Application Data

[63] Continuation-in-part of Ser. No. 375,506, May 6, 1982, Pat. No. 4,481,647.

[51] Int. Cl.³ .............................................. H04L 1/00
[52] U.S. Cl. ..................................... 375/10; 364/551; 364/569
[58] Field of Search ......................... 375/3, 10, 76, 94; 364/551, 569; 307/561, 603; 328/72; 324/57 DE, 77 H; 333/152; 371/5

[56] References Cited

U.S. PATENT DOCUMENTS

| | | | |
|---|---|---|---|
| 3,706,091 | 12/1972 | May, Jr. ................................. | 375/76 |
| 4,223,404 | 9/1980 | Lowenschuss ........................ | 375/3 |
| 4,349,918 | 9/1982 | Gordon .................................. | 375/3 |
| 4,351,059 | 9/1982 | Gregoire ............................... | 375/10 |
| 4,380,816 | 4/1983 | Nicholls ................................ | 375/3 |
| 4,428,076 | 1/1984 | Schvon ................................... | 375/10 |

Primary Examiner—Robert L. Griffin
Assistant Examiner—Stephen Chin
Attorney, Agent, or Firm—John H. Bouchard; John P. Dellett; Robert S. Hulse

[57] ABSTRACT

An input apparatus for a multi-channel device, such as a logic analyzer, is disclosed, the input apparatus providing the multi-channel device with a programmable set-up and hold feature. The multi-channel device acquires a logic signal from a product under test, the logic signal having associated therewith an actual set-up and hold time with respect to an external clock signal. The actual set-up and hold times are entered into the multi-channel device via a keyboard and a display. The device has stored therein a desired set-up and hold time required by the logic signal relative to the external clock signal. In accordance with the actual and the desired set-up and hold times, the multi-channel device changes the relative orientation of the acquired logic signal with respect to the external clock signal, along the time axis until the set-up and hold times of the acquired logic signal are changed from the actual value to the desired value. As a result, the multi-channel device can be used to troubleshoot any product under test regardless of the set-up and hold times of the generated logic signals, relative to an external clock signal, associated therewith.

4 Claims, 7 Drawing Figures

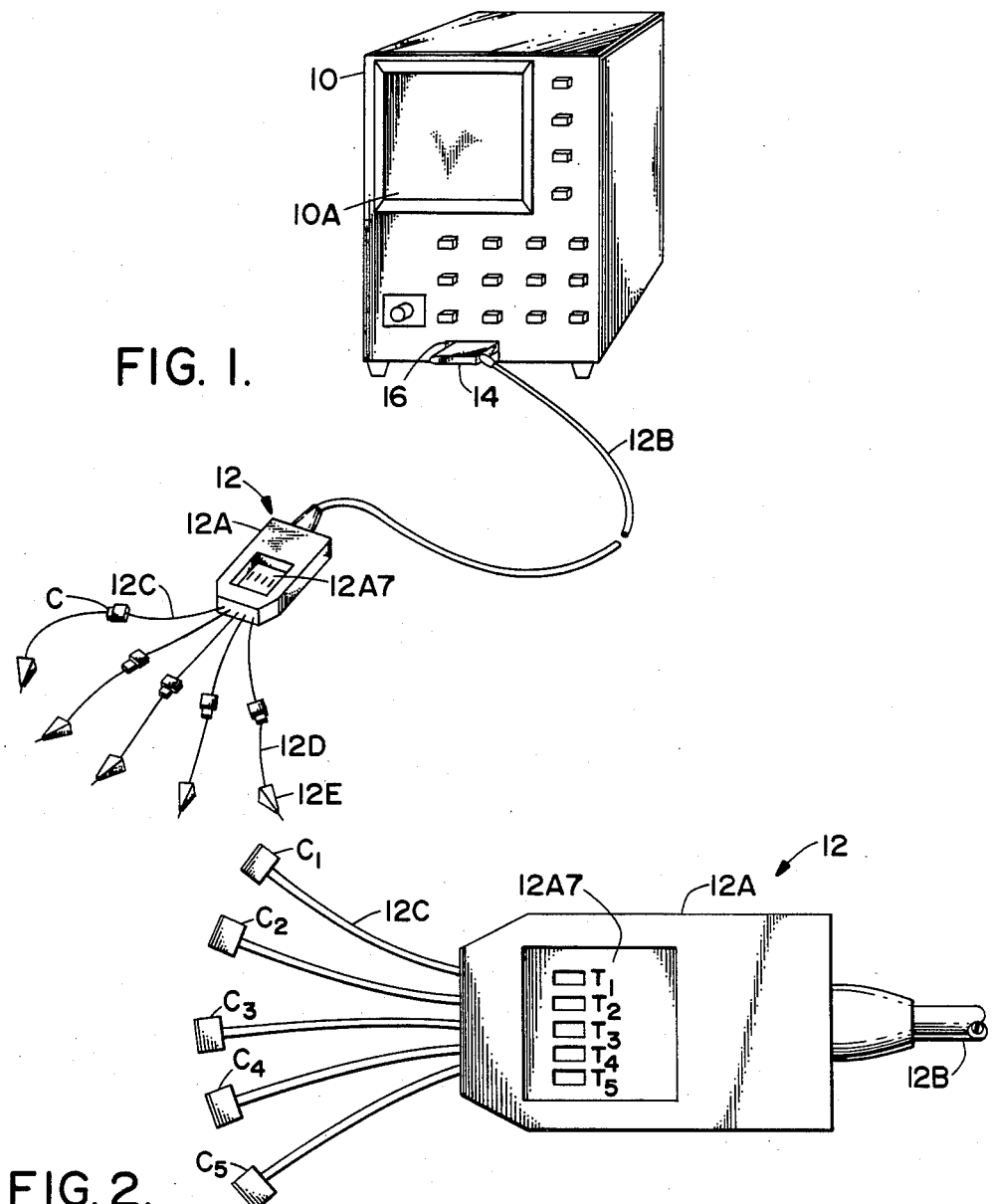
FIG. 1.
FIG. 2.
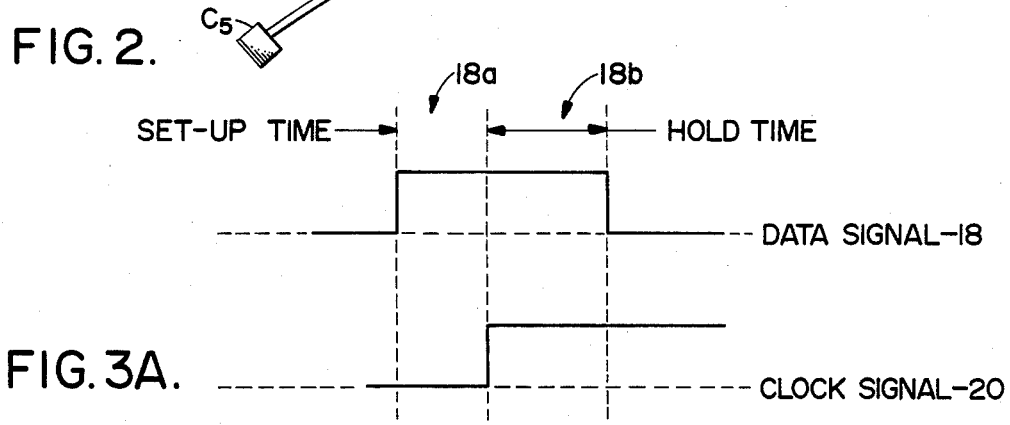
FIG. 3A.

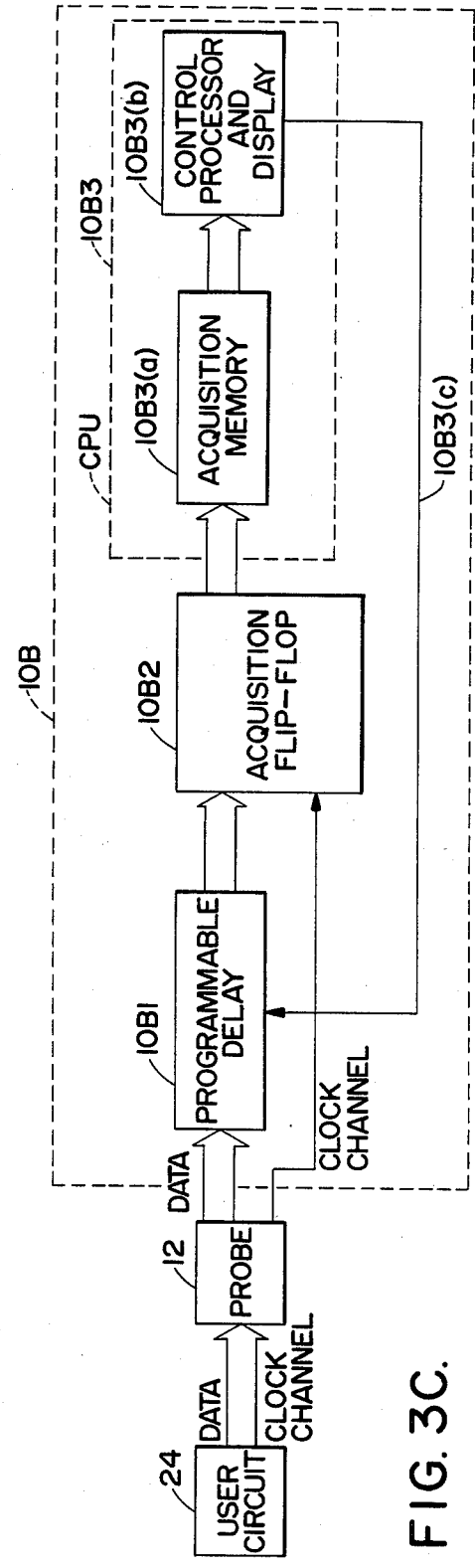

APPARATUS INCLUDING A PROGRAMMABLE SET-UP AND HOLD FEATURE

CROSS-REFERENCE TO RELATED APPLICATIONS

This application is a continuation-in-part of application Ser. No. 375,506 filed on May 6, 1982, U.S. Pat. No. 4,481,647.

BACKGROUND OF THE INVENTION

1. Field of the Invention

The subject matter of the present invention relates generally to an input apparatus for a multi-channel device, such as a logic analyzer, which provides said multi-channel device with a programmable set-up and hold feature wherein the set-up and hold times of a data signal acquired by said input apparatus, relative to a clock signal, are programmable by a user.

2. Description of the Prior Art

Most advanced electronic equipment in use today include complex integrated circuit logic systems, such as those used in microprocessors. Complicated multi-channel devices, such as a logic analyzer, are used for trouble-shooting these logic systems. The multi-channel device includes a multi-channel probe attached thereto, for example, a 4 channel probe for acquiring a plurality of logic signals from the logic system. The logic signals are stored in an acquisition memory within said multi-channel device. The stored logic signals are retrieved therefrom for display on the multi-channel device. A large number of cables are used for connecting each probe to the multi-channel device. Usually, the length of any one cable is different than the length of any of the other adjacent cables. The logic signals must be transmitted through these cables prior to storage in the acquisition memory. However, if a particular cable is longer than another adjacent cable, a longer period of time is required for the logic signal to be transmitted through the former cable than it is for the logic signal to be transmitted through the adjacent cable. Any difference in cable length, among these cables, results in skewed logic data signals displayed on the cathode ray tube (CRT) screen of the multi-channel device. These skewed data signals introduce a measurement error. Skewed logic data signals are also produced as a result of differences in propagation time delay through the input circuitry of the logic analyzer. This measurement error is not acceptable, especially when it occurs in conjunction with high-frequency, or high-acquisition rate test instruments. In order to eliminate this measurement error, the multi-channel device includes an input apparatus which compensates for the differences in cable length existing within the channels of said multi-channel device. The input apparatus therefore, ensures that the acquired data is displayed properly on the CRT screen, and thereby eliminates the possibility of introducing the above measurement error. However, in order to properly store the logic signals in the acquisition memory, the set-up and hold times of the logic signal generated by the logic systems being tested, and acquired by the multi-channel device, relative to an external clock signal, must be set to predetermined values.

Further, the set-up and hold times of the acquired logic signal generated by the logic system being tested, relative to the external clock signal, are usually different than the predetermined values. Therefore, the acquired logic signal cannot be properly stored in the acquisition memory. Consequently, the multi-channel device cannot be used to troubleshoot these logic systems. This severely limits the usefulness of the multi-channel device.

SUMMARY OF THE INVENTION

It is a primary object of the present invention to provide a multi-channel device having a programmable deskewing feature associated therewith whereby the set-up and hold times of the logic signal acquired by said multi-channel device, relative to the external clock signal, may be altered in accordance with a programmed set-up and hold time such that logic signals having a specific set-up and hold time are produced, relative to said external clock signal, said specific set-up and hold times corresponding to said predetermined values required for proper storage of said logic signals in said acquisition memory.

It is still another object of the present invention to provide a multi-channel device having said programmable deskewing feature whereby a display is presented on the CRT screen of said multi-channel device, said display having a field disposed therein for entering said programmed set-up and hold time into said multichannel device, said programmmed set-up and hold time being used by said multi-channel device to convert said set-up and hold times of said logic signal acquired by said multi-channel device, relative to said external clock, into said specific set-up and hold time corresponding to said predetermined values required for proper storage of said logic signals in said acquisition memory.

These and other objects of the present invention are accomplished by further including within said input apparatus a means for introducing the set-up and hold times of the acquired logic signals and a means for converting these times associated with the logic signal, relative to the external clock, into a specific set-up and hold time required by said multi-channel device. Said input apparatus includes a fixed time delay means and a variable time delay means. The fixed time delay means is associated with one of the cables (clock channel) of the probe attached to said multi-channel device. The variable time delay means is associated with each of the other cables (each of the data channels) of said probe. Each of the variable time delay means are connected, on one end, to said acquisition memory. The other end of the acquisition memory is connected to a microprocessor and a Random Access Memory (RAM). The microprocessor is also connected to each of the variable delay means. A key input means, including a keyboard and a display, is also connected to the microprocessor. The operator enters the set-up and hold times of the acquired logic signals into the multi-channel device via the keyboard and the display. The microprocessor receives this information and generates an output signal in response thereto in accordance with the instructions stored in the RAM, the output signals energizing the variable delay means. The time delay associated with the variable delay means changes in response thereto.

As a result of the changed time delay associated with the variable delay means, the logic signals generated from the variable delay means have said specific set-up and hold times associated therewith (relative to said external clock signals) corresponding to said predetermined values required for proper storage of said logic signals in said acquisition memory.

Further scope of applicability of the present invention will become apparent from the description given hereinafer. However, it should be understood that the details of the description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A full understanding of the present invention will be obtained from the detailed description given hereinbelow and the accompanying drawings which are given by way of illustration only, and thus are not limitative of the present invention, and wherein:

FIG. 1 is a perspective view of a typical multi-channel device, for example, a logic analyzer instrument incorporating the input apparatus of the present invention and a probe attached thereto;

FIG. 2 is an enlarged plan view of the probe of FIG. 1 including a probe pod and a plurality of probe tips attached thereto;

FIG. 3a illustrates the definition of a set-up time and a hold time associated with a data signal relative to an external clock signal.

FIG. 3b illustrates a display on the multi-channel device of the present invention, the display including a "set-up/hold time" field.

FIG. 3c illustrates in greater detail the input apparatus of the present invention which is responsible for providing the programmable deskewing feature.

FIG .4 illustrates in still greater detail the input apparatus of the present invention, and, in particular, the configuration of a programmable delay circuit, a portion of said input apparatus.

Figure 5:
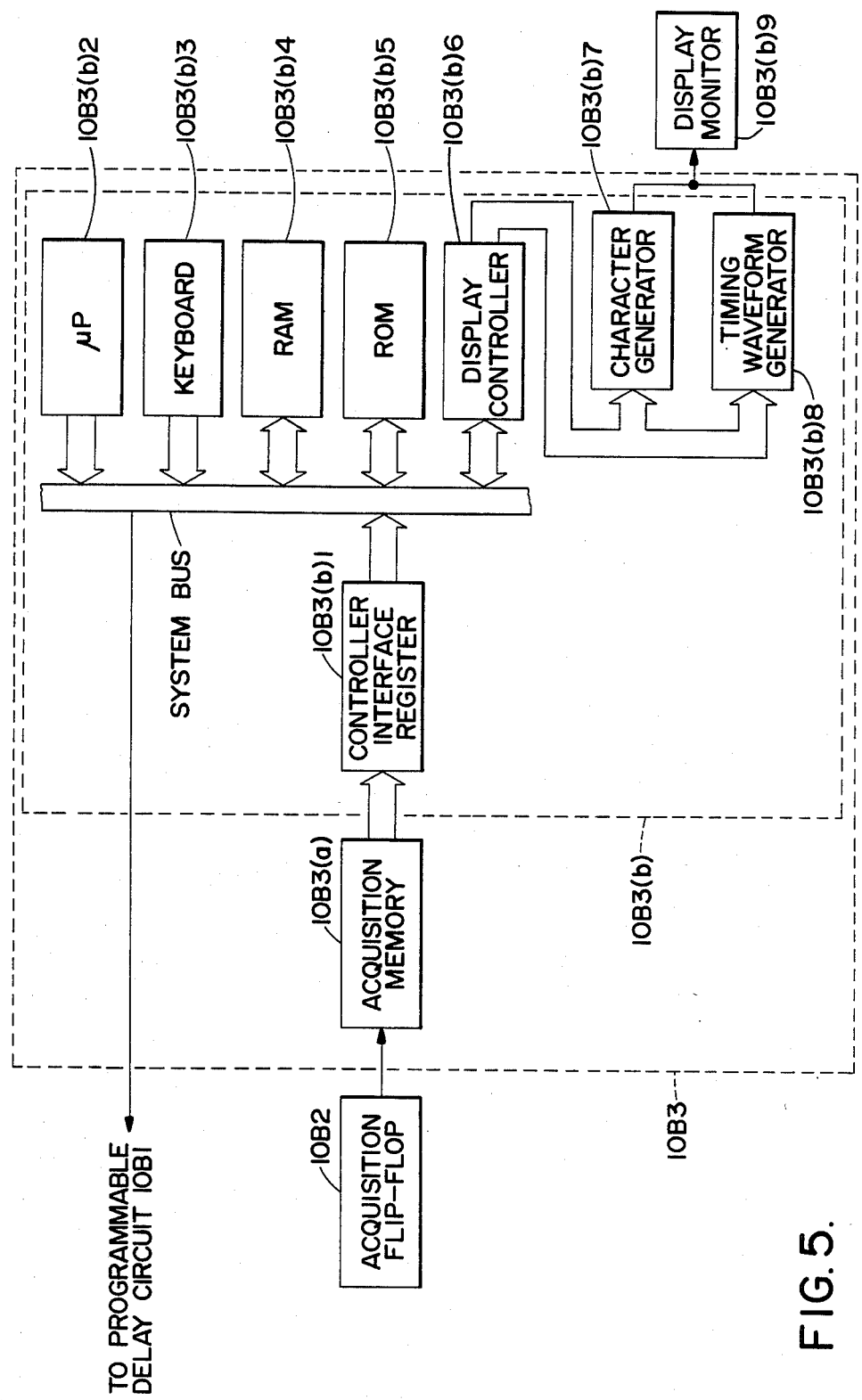

FIG. 5 illustrates in still greater detail the input apparatus of the present invention, and, in particular, the configuration of a control processor and display circuit, a portion of said input apparatus.

DESCRIPTION OF THE PREFERRED EMBODIMENT

One preferred embodiment of the present invention will be described in detail hereinafter by reference to the accompanying drawings. FIG. 1 illustrates a simplified perspective view of a multi-channel device 10, such as a logic analyzer and an acquisition probe 12 attached thereto. Acquisition probe 12 includes probe pod 12A having connected on one end thereof insulated short wires 12C, connectors C, connected to the ends of the insulated short wires 12C, probe tips 12D connected to the individual connectors C, respectively, and a clip 12E connected, respectively, to each probe tip 12D. Any conventional type of clip 12E may be used for acquiring logic data signals from a product under test. Probe pod 12A has connected on the other end thereof a cable 12B. A data connector 14 is connected to the logic analyzer 10 of the present invention via the cable 12B. The data connector 14 resides in a data input port 16. The probe pod 12A further includes terminal portions 12A7. The function of these terminal portions 12A7 will be described hereinafter.

In the embodiment shown in FIG. 1, the probe pod 12A has five short wires 12C input thereto, four of the wires representing data channels for transmission of the logic data signals therethrough, one wire representing a clock channel for transmission of a reference clock signal therethrough. Although five wires 12C have been illustrated as being connected to the probe pod 12A, normally, many more insulated short wires 12C are connected thereto for connection to the terminals of a product under test.

Figure 4:
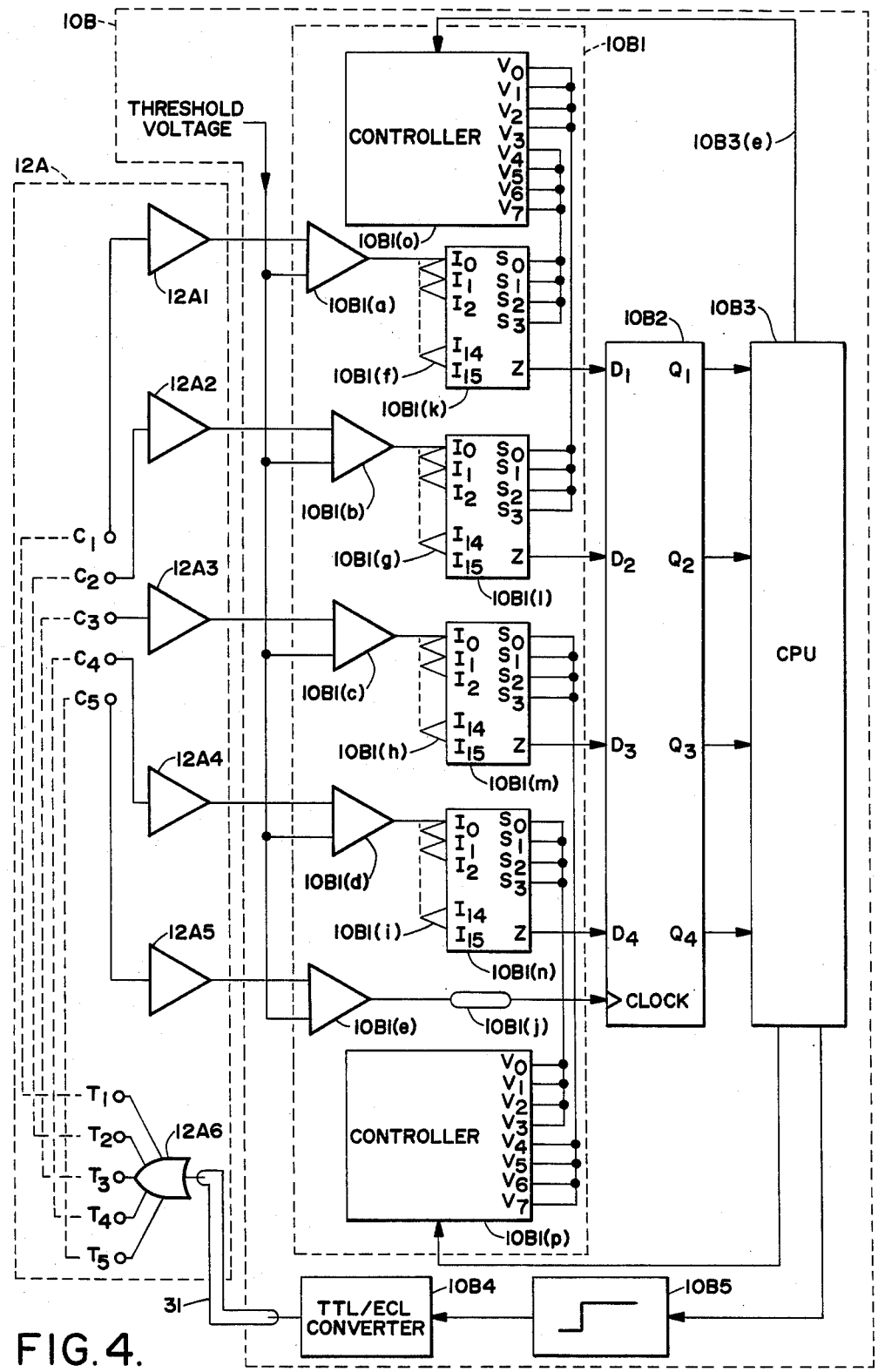

Probe pod 12A further includes therein five ECL buffer amplifiers (shown in FIG. 4). The outputs of each of the buffer amplifiers are coupled through transmission lines within cable 12B and through the data connector 14 to the data input port 16 of the logic analyzer 10. The data input port 16 has a plurality of terminals therein for connection to the terminals within the data connector 14. In the example shown in FIG. 1, the data input port 16 has four terminals associated with the four data channels, and an additional terminal associated with the clock channel.

The input wires 12C and the transmission lines within the cable 12B may have different lengths, depending on the particular channel. The different lengths cause the different propagation times of the logic signals transmitted therethrough.

Referring to FIG. 2, an enlarged plan view of the probe 12 is illustrated, including the probe pod 12A, the input wires 12C, and the connectors C attached thereto, and one end of the cable 12B. Probe pod 12A includes the connector terminal portion 12A7, the connector terminal portion 12A7 further including terminals T1 through T5. A common clock signal is generated in the multi-channel device 10 and is transmitted through the data connector 14 via said additional terminal, through a clock transmission line in cable 12B, the common clock signal being applied to each of the terminals T1 through T5 in the probe pod 12A. Since the same common clock signal is applied to each of the terminals T1 through T5, each of these clock signals, applied to terminals T1 through T5, would agree in timing if displayed on the CRT screen 10A of the multi-channel device 10. Connectors C1 through C5 may then be connected, respectively, to terminals T1 through T5. When connectors C1 through C5 are thus connected, terminals T1 through T5 apply the common clock signal (equal in timing) to the respective connectors C1 through C5. These clock signals are then retransmitted to the multi-channel device 10 via the input wires 12C, the probe pod 12A, the data transmission lines in cable 12B (five transmission lines in the example of FIG. 2), and the data connector 14, which is connected to the multi-channel device 10. Since each of the data transmission lines in cable 112B may have a different length with respect to the other transmission lines, the clock signals transmitted through each of the data transmission lines in cable 12B, corresponding to each of the wires 12C, will be applied to the multi-channel device 10 at different points in time. Another circuit internal to the multi-channel device 10 will compare the arrival time of the clock signals input thereto from each of the transmission lines in cable 12B, corresponding to the data channels (four in the example of FIG. 2) with the arrival time of a reference clock signal input thereto from the additional, reference clock channel. A variable time delay circuit within said another ciruit, corresponding to each of the data channels in the cable 12B, will change its time delay in response to the comparison made between the arrival time of the clock signal in each of the data channels and the reference clock signal. When the time delay associated with each of the variable time delay circuits is changed accordingly, the clock signals associated with each of the data channels, will be deskewed with respect to the reference clock signal. If the clock signals associated with each of the data channels are deskewed with respect to the reference clock signal, the differential time difference between the leading edge of a pulse included within a clock signal in a data channel and the leading edge of a pulse included within the reference clock signal in the reference clock channel is approximately equal to zero.

Referring to FIG. 3a, an illustration of the definition of a set-up time and a hold time of a data signal relative to a clock signal is provided. In FIG. 3a, a data signal 18 is shown on a time axis relative to a clock signal 20. The set-up time 18a is defined to be the differential time difference between the leading edges of the data signal 18 relative to the clock signal 20. The hold time 18b is defined to be the amount of time the data signal 18 remains at a constant state after the clock signal 20 changes from a low to a high state.

As previously mentioned, the multi-channel device acquires data signals from a product under test, and stores the data signals therein. The multi-channel device also acquires an external clock signal from the product under test. However, in some multi-channel devices 10, it is not possible to properly store a data signal therein if the set-up/hold times of the acquired data signal relative to the external clock signal have values which are not equal to certain predetermined values. For example, in order to properly store data signals in a logic analyzer, the set-up/hold times of an acquired data signal to be stored therein, relative to an external clock signal, must be 3.0/0 nanoseconds, respectively. However, the set-up/hold times of the data signals generated by a product under test, relative to an external clock signal, may be something other than 3.0/0 nanoseconds. Consequently, these data signals may not be properly stored in the logic analyzer. The present invention is adapted to remedy this deficiency by allowing the multi-channel device to change the set-up/hold times of an acquired data signal, relative to an external clock signal, until the times are equal to the predetermined values, e.g., 3.0/0 nanoseconds in a logic analyzer.

Referring to FIG. 3b, a typical display on the mutlichannel device of the present invention is illustrated. In FIG. 3b, a "set-up/hold time" field 22 appears on the display. The operator enters the set-up and hold time associated with the data signals generated by the product under test. If the entered set-up and hold times are not equal to the predetermined values, the multi-channel device changes the entered set-up and hold times, relative to an external clock, such that the changed set-up and hold times are equal to the predetermined values. The resultant data signal, having the changed set-up and hold times associated therewith, are then properly stored in the acquisition memory of said multichannel device.

In FIG. 3c, a system diagram depicting the input apparatus of the present invention is illustrated, the apparatus providing the programmable set-up and hold feature of the present invention.

In FIG. 3c, a user's circuit 24, the product under test, generates data signals and clock signals. An acquisition probe 12 is connected to the user's circuit and receives the data signals and clock signals. The probe 12 transmits the data signals via a plurality of data channels to an input apparatus 10B disposed within the multichannel device 10. The apparatus 10B includes the following elements: a programmable delay circuit 10B1 connected to the probe 12 via the dots channels, the delay circuit 10B1 receiving the data signals from the probe 12 and providing an appropriat time delay in response thereto; an acquisition flip-flop 10B2 connected to the output of said programmable delay circuit 10B1 and connected to said probe 12 for receiving the delayed data signals from the delay circuit 10B1, and for receiving a clock signal from probe 12; and a central processing unit (CPU) 10B3 connected to the output of said acquisition flip-flop 10B2.

If a data signal is applied to the flip-flop 10B2 before a clock signal is applied thereto, an output signal of one value (high or low) is developed in response thereto. If the data signal is applied to the flip-flop 10B2 after the clock signal is applied thereto, an output signal of another value, opposite to said one value, is developed in response thereto.

The output signal from the acquistion flip-flop 10B2 is applied to the central processing unit (CPU) 10B3. The CPU 10B3 comprises an acquisition memory 10B3(a), which receives the output signal from the acquisition flip-flop 10B2, and stores the output signal therein, and a control processor and display 10B3(b) connected to an output terminal of the acquisition memory 10B3(a). The control processor and display 10B3(b) is connected, at an output terminal thereof, to the programmable delay circuit 10B1 for instructing said delay circuit to increase or decrease the time delay associated therewith in accordance with the set-up/hold time entered into said multi-channel device 10 via field 22 of the display shown in FIG. 3b.

A detailed description of the construction of probe pod 12A and the programmable delay circuit 10B1 will now be described with reference to FIG. 4 of the drawings. Referring to FIG. 4, probe pod 12A includes terminals T1 through T5. Connectors C1 through C5 are adapted to be connected to terminals T1–T5 via wires 12C. In FIG. 4, connectors C1–C5 and terminals T1–T5 correspond, respectively, to five channels, channels 1–4 being data channels, channel 5 being a clock channel. Probe pod 12A further includes buffer amplifiers 12A1, 12A2, 12A3, 12A4, and 12A5 which are connected, respectively, to connectors C1–C5. A gate 12A6 is connected, at its output end, to each of the five terminals T1–T5.

The input apparatus 10B comprises the programmable delay circuit 10B1. The delay circuit 10B1 further includes comparators 10B1(a), 10B1(b), 10B1(c), 10B1(d), and 10B1(e), corresponding, respectively, to the buffer amplifiers 12A1, 12A2, 12A3, 12A4, and 12A5 internal to the probe pod 12A. Apparatus 10B also includes a Transistor-to-Transistor Logic (TTL)/Emitter Coupler Logic (ECL) converter 10B4 connected to the input of gate 12A6, the latter being internal to the probe pod 12A. A clock generator 10B5 is connected at its output to the input of the TTL/ECL converter 10B4.

The TTL/ECL converter is simply a resistor network implemented, for example, with an 820 ohm resistor connected to ground, a 265 ohm resistor connected to the other end of the 820 ohm resistor, and a 180 ohm resistor connected to the other end of the first mentioned 265 ohm resistor. The TTL input resides at the junction between the first mentioned 265 ohm resistor and the 820 ohms resistor. The ECL output resides at the junction between said 180 ohm resistor and the first mentioned 265 ohm resistor.

Tapped delay lines 10B1(f)–10B1(i) are connected to the output of comparators 10B1(a)–10B1(d), respectively. A fixed delay line 10B1(j) is connected to the output of comparator 10B1(e). Multiplexers 10B1(k) through 10B1(n) are connected to each of the tapped delay lines 10B1(f) through 10B1(i). Controller 10B1(o) is connected to multiplexers 10B1(k) and 10B1(l). Controller 10B1(p) is connected to multiplexers 10B1(m) and 10B1(n). Terminals V0–V3 and V4–V7 of controller 10B1(o) are connected to terminals S0–S3 of multiplexers 10B1(l) and 10B1(k), respectively. Terminals V0–V3 and V4–V7 of controller 10B1(p) are connected to terminals S0–S3 of multiplexers 10B1(n) and 10B1(m), respectively. The controllers / 10B1(o) and 10B1(p) and 10B1(p) may be identified by industry standard part number 100164. An acquisition flip-flop 10B2 is connected to each of the multiplexers 10B1(k)–10B1(n). Lead wires connect the input of acquisition flip-flop 10B2 to the outputs of each of the multi-plexers 10B1(k) through 10B1(n) and to the fixed delay line 10B1(j). The acquisition flip-flop 10B2 can be identified by industry standard part number 100131 and is a triple-D input flip-flop. The central processing unit (CPU) 10B3 is connected to the output of the acquisition flip-flop 10B2. Lead wires connect the flip-flop 10B2 to the CPU 10B3, the number of lead wires corresponding to the number of input lead wires which connect the multiplexers 10B1(k)–10B1(n) to the acquisition flip-flop 10B2. An output lead connects the CPU 10B3 to an input terminal of the clock generator 10B5. Another output lead from the CPU 10B3 is connected to an input of the controller 10B1(p). A further output lead connects the CPU 10B3 to the controller 10B1(o).

Referring to FIG. 5, a system block diagram of the central processing unit (CPU) 10B3 is illustrated.

The CPU 10B3 includes an acquisition memory 10B3(a) and a control processor and display circuit 10B3(b). The acquisition memory 10B3(a) is connected at its input terminal thereof to the acquisition flip-flop 10B2. The output terminal of the acquisition memory 10B3(a) is connected to the control processor and display circuit 10B3(b). The control processor and display circuit 10B3(b) further includes a controller interface register 10B3(b)1 connected at its input terminal thereof to the acquisition memory 10B3(a). The Controller Interface Register 10B3(b)1 is connected to a system bus.

The following elements are also connected to the system bus: a microprocessor 10B3(b)2, a keyboard 10B3(b)3, a Random Access Memory (RAM) 10B3(b)4, a Read Only Memory (ROM) 10B3(b)5, and a display controller 10B3(b)6. A character generator 10B3(b)7 and a timing waveform generator 10B3(b)8 connected to the display controller 10B3(b)6. A display monitor 10B3(b)9 is connected to the timing waveform generator and to the character generator.

The functional operation of the present invention will now be described by first describing the manner by which the data signals are deskewed as against an internal clock signal, and then be describing the manner by which the present invention adjusts the set-up and hold time of the acquired data signals, relative to an external clock signal, such that the set-up and hold times of the data signals to be stored in the acquisition memory are approximately equal to the predetermined values (e.g.,3.0 nsec/0 nsec for a logic analyzer).

Referring to FIG. 4, the CPU 10B3 instructs the clock generator 10B5 to develop a TTL clock signal therefrom. This TTL clock signal is applied to the TTL/ECL converter 10B4. The converter converts the TTL clock signal to an ECL clock signal. The converted clock signal having the ECL level is applied via a coaxial cable 31 to the input end of the gate 12A6. The gate 12A6 is connected, at its output, to each of the terminals T1–T5 in the probe pod 12A, the converted clock signal being applied to each of the terminals T1–T5. The connectors C1–C5 are then connected to the respective terminals T1–T5 via the wires 12C. Each of the clock signals are then transmitted from the multichannel device 10, through terminals T1–T5, and to the connectors C1–C5. The clock signals are then applied to buffer amplifiers 12A1–12A5. The output of these buffer amplifiers reflect an amplified version of these converted clock signals. The amplified converted clock signals, generated from the buffer amplifiers, are applied to one input terminal of the comparators 10B1(a)–10B1(e). The other input terminal of these comparators have a threshold voltage applied thereto (the threshold voltage could be approximately 3.65 volts when referenced between +5V and ground). If the amplified converted clock signals, input to the comparators, are higher than the threshold voltage level, a high output signal is generated therefrom. If the amplified converted clock signals are lower than the threshold voltage level, a low level output signal is generated therefrom. The output signals from these comparators are generated at different times due to the different lengths of the transmission lines within cable 12B.

Each of the delay lines 10B1(f)–10B1(i) have sixteen input taps, I0–I15. Each tap of the delay line associated with a single data channel gives, for example, approximately 0.4 nsec delay time, so that the total adjustment range is approximately 6.4 nsec for each individual data channel. The output end of each of the comparators 10B1(a)–10B1(d) is connected, respectively, to an end tap of one of the delay lines 10B1(f)–10B1(i), for example, tap I0. Multiplexers 10B1(k)–10B1(n) are connected to each of the delay lines 10B1(f)–10B1(i). Each multiplexer has four control input terminals, S0–S3. Each controller 10B1(o) and 10B1(p) has eight output terminals V0–V7. Four of the output terminals of controller 10B1(o)–(V4–V7) are connected to the control input terminal (S0–S3) of multiplexer 10B1(k). The other four output terminals of controller 10B1(o) (V0–V3) are connected to the control input terminals S0–S3 of multiplexer 10B1(l). Similar connections are made between controller 10B1(p) and multiplexers 10B1(m) and 10B1(n). The signals present on the four output terminals V4–V7 of controller 10B1(o), for example, represent a 4-bit binary number, this 4-bit binary signal energizing terminals S0–S3 of multiplexer 10B1(k). Similarly, the signals present on terminals V0–V3 also represent a 4-bit binary number, this 4-bit binary signal energizing terminals S0–S3 of multiplexer 10B1(l). Four-bit binary signals also energize terminals S0–S3 of multiplexers 10B1(m) and 10B1(n).

Each multiplexer has an output terminal Z, which is connected to one of the input taps I0–I15. The controllers 10B1(o) and 10B1(p), via the 4-bit binary signals energizing the input terminals S0–S3 of the multiplexers 10B1(k)–10B1(n), determine and control to which input terminal I0–I15 the output terminal Z is connected. For example, controller 10B1(o) generates a 4-bit binary signal for terminals (V4–V7) representing a 4-bit binary number, the 4-bit binary signal energizing terminals (S0–S3) of multiplexer 10B1(k). The particular 4-bit binary number determines to which input terminal (I0–I15) of multiplexer 10B1(k), the output terminal Z is connected.

As mentioned herinbefore, the output signals from each of the comparators 10B1(a)–10B1(d) will arrive at their respective tapped delay lines 10B1(f)–10B1(i) at different points in time, due to the variations in the cable length of the individual transmission lines within cable 12B. Initially, each controller 10B1(o) and 10B1(p) is reset, and output terminal Z of each of the multiplexers 10B1(k)–10B1(n) is connected to a center input tap of the multiplexer, for example, tap I7. The output signal, generated from comparator 10B1(a), is delayed a certain amount in delay line 10B1(f) corresponding to center tap I7. A delayed output signal is generated from the multiplexer 10B1(k) at terminal Z, the signal being received by input terminal D1 of the acquisition flip-flop 10B2. In addition, the clock terminal of acquisition flip-flop receives a clock pulse as well. If the clock pulse is received at the clock terminal of flip-flop 10B2 before the delayed output signal from multiplexer 10B1(k) is received at terminal D1, the output Q1 of the flip-flop 10B2 will be low, CPU 10B3 will detect this low output at terminal Q1 and flip-flop 10B2 and will generate an output signal, the output signal energizing controller 10B1(o) in response thereto. Controller 10B1(o) will then, in response thereto, generate a 4-bit binary signal representative of a 4-bit binary number, the number determining to which input tap (I0–I15) the output terminal Z should be connected. The 4-bit binary signal directs multiplexer 10B1(k) to decrease the delay time of data channel 1, that is, to reconnect the output terminal Z of multiplexer 10B1(k) to tap I6, in lieu of I7. Connection of the output terminal Z of multiplexer 10B1(k) to tap I6 will subtract 0.4 nsec delay time from the total amount of delay which takes place when the output of comparator 10B1(a) passes through the delay line 10B1(f). In this way, when terminal Z is connected to tap I6, the delayed output signal from terminal Z of multiplexer 10B1(k) will be generated at a time prior to the time of generation of this output signal from terminal Z when Z was connected to tap I7. CPU 10B3 then instructs the clock generator 10B5 to generate another clock signal. The above described operation will repeat again, until output Q1 of the acquisition flip-flop 10B2 becomes high, that is, when the delayed output signal generated from terminal Z of multiplexer 10B1(k) is received at terminal D1 before the clock signal is received at the clock terminal of the flip-flop 10B2. When the CPU 10B3 detects this transition, from low to high, corresponding to the output signal at terminal Q1 of flip-flop 10B2, CPU 10B3 will instruct controller 10B1(o) to store therein the current binary number represented by the 4-bit binary signal. At this point, data channel 1 is deskewed against the clock channel. The variation in the lengths of the transmission lines within cable 12B have been taken into account. That is, the multi-channel device has been calibrated to take into account this variation in transmission line length in cable 12B. The difference in propagation time elapsed between the time for propagation of the internal clock signal through data channel 1 and the time for propagation of the internal clock signal through the clock channel has been substantially eliminated.

The other data channels, 2–4 are also deskewed against the clock channel in the same manner as described above with respect to data channel 1. The time of arrival of the logic signals in each of the other data channels, 2–4, is compared with the time of arrival of the reference clock pulse received at the clock terminal of flip-flop 10B2, and the delay is adjusted in delay lines 10B1(g)–10B1(i) in accordance with these comparisons. As a result, the times for propagation of the clock signals through the data channels are made equal to the time for propagation of the clock signal through the clock channel.

As stated hereinabove, since the data signals are now deskewed against the clock signal, the variation in the lengths of the transmission lines in cable 12B will no longer affect the display of the data signals on the CRT screen of the multi-channel device. The multi-channel device has been calibrated to compensate for the difference in lengths of the transmission lines in cable 12B and to therefore eliminate any possibility of measurement error. However, another problem presents itself. In order to properly store the data signals in the acquisition memory 10B3(a), the set-up/hold times of the acquired data signals, relative to an external clock signal (in lieu of the internal clock signal mentioned hereinbefore), to be stored in the acquisition memory, must be equal to predetermined values (in logic analyzers, the set-up/hold times are 3.0 nsec/0 nsec, respectively). The user's circuit (the product under test) may not generate data signals having set-up and hold times associated therewith equal to said predetermined values.

Therefore, the present invention adds an additional feature to the multi-channel device of the prior art in that the operator may alter the set-up and hold times of the acquired data signals, via keyboard 10B3(b)3 and display monitor 10B3(b)9. The microprocessor 10B3(b)2, in accordance with instructions stored in the ROM 10B3(b)5, generates a 4-bit binary signal via line 10B3(c), in FIG. 5, representative of a 4-bit binary number, the 4-bit binary signal energizing the controllers 10B1(o) and 10B1(p) in the programmable delay circuit 10B1. The controllers 10B1(o) and 10B1(p), in response thereto, adjust the connection of the output terminal Z of the multiplexers 10B1(k)–10B1(n) to one of the input taps I0–I15 thereof until the delayed output data signal generated from the output terminal Z has associated therewith a set-up and hold time, relative to an external clock signal, which is approximately equal to said predetermined values (i.e., 3.0 nsec/0 nsec in a logic analyzer multi-channel device).

More specifically, the instructions encoded in the ROM 10B3(b)5, of FIG .5, contain information relating to the set-up and hold times, associated with the acquired data signals, which are required in order to properly store said data signals in the acquisition memory 10B3(a)--e.g.,3.0 nsec/0 nsec when using a logic analyzer. The microprocessor received the actual set-up and hold times of the acquired data signals, entered via the keyboard 10B3(b)9. In response to the required set-up and hold times encoded in the ROM and to the equal set-up and hold times entered via the keyboard 10B3(b)3, the microprocessor 10B3(b) calculates the amount of further time delay required to ensure that the data signals to be stored in the acquisition memory 10B3(a) have associated therewith set-up and hold times equal to said predetermined values (i.e., 3.0 nsec/0 nsec for a logic analyzer). The microprocessor develops via line 10B3(c) in FIG. 5, an output signal, the output signal energizing the controllers 10B1(o) and 10B1(p). A 4-bit binary signal is developed therefrom via terminals V0–V3 and/or V4–V7, the 4-bit binary signal energizing terminals S0–S3 of the multiplexers 10B1(k)-10B1(n). Depending upon the binary number associated with the binary signal energizing terminals S0-S3, one of the proper input taps (I0-I15) is selected and the output terminal Z is connected thereto. This ensures that said amount of further time delay is implemented in the delay lines 10B1(f)-10B1(i). As a result, the data signals stored in the acquisition memory 10B3(a) have associated therewith set-up and hold times, relative to an external clock signal, approximately equal to said predetermined values, regardless of the set-up and hold times associated with the data signals (relative to said external clock signal) acquired from the users circuit.

The instructions encoded in ROM 10B3(b)5 are characterized by the following algorithm:

Before any changes of set-up and hold are allowed, a successful deskew must have been performed. This procedure calculates a value for each channel, which when programmed into the hardware will assure the guaranteed set-up and hold values. A variable, CHANGE_VALUE, is kept that reflects the user variance from the calculated values. CHANGE_VALUE may be modified by moving the screen cursor to the SET-UP/HOLD field, the INCR key or the DECR key. The algorithm for changing the final set-up and hold values is as follows:

1. After the deskew is complete initialize the variable CHANGE_VALUE to 0.
2. INCR pressed -- if the deskew value +CHANGE_VALUE +1 on all channels is less than or equal to the maximum value (which is 14) then add one to CHANGE_VALUE, display the new set-up and hold value, and look for another key pressed,
3. DECR pressed -- if the deskew value+CHANGE_VALUE−1 on all channels is greater than or equal to the minimum value (which is 0) then substract one from CHANGE_VALUE, display the new set-up and hold value, and look for another key pressed.
4. Continue to check for INCR, DECR keys pressed while the screen cursor is in the SET-UP/HOLD field.
5. When acquisition is about to start, program each channel's deskew value plus CHANGE_VALUE.

The range of change for the set-up and hold value is a maximum of +4.2nS of set-up and −1.2 nS of hold, and a minimum of 1.8nS of set-up and +1.2nS of hold. Depending on how the channels originally deskewed, the maximum may only increment by none, one, two, or three, and the minimum may decrease by none, one, two or three steps.

Each step (INCR or DECR) represents a change of 400 pS.

The invention being thus described, it will be obvious that the same may be varied in many ways. Such variations are not to be regarded as a departure from the spirit and scope of the invention and all such modifications as would be obvious to one of ordinary skill in the art are intended to be included within the scope of the following claims.

We claim:

1. An apparatus for controlling the set-up and hold times of an acquired data signal with respect to a clock signal, comprising:
    means for entering an actual set-up and hold time associated with said acquired data signal relative to said clock signal;
    means for storing a desired set-up and hold time associated with said acquired data signal relative to said clock signal; and
    control means responsive to the actual set-up and hold time entered via the means for entering and to the desired set-up and hold time stored in the means for storing for changing the relative timing of the acquired data signal with respect to said clock signal until the set-up and hold times associated with said acquired data signal are changed from the actual value to the desired value.

2. The apparatus of claim 1 wherein said control means comprises:
    processor means responsive to the set-up and hold times entered via the means for entering and to the set-up and hold times stored in the means for storing for calculating an amount of time delay required to change said relative timing of the acquired data signal with respect to said clock signal and for developing an output signal in accordance with the calculation; and
    time delay means responsive to said acquired data signal and to said clock signal, and further responsive to the output signal from said processor means for delaying said acquired data signal until the set-up and hold times of the acquired data signal, relative to said clock signal, are changed from the actual value to the desired value.

3. The apparatus of claim 2 wherein the means for entering comprises:
    key-input means for entering said actual set-up and hold times; and display means for visually confirming that said actual set-up and hold times have been entered into said apparatus via said key-input means.

4. The apparatus of claim 3 wherein said display means comprises a set-up/hold time field, said actual set-up and hold times being entered into said apparatus via said set-up/hold time field on said display means.

* * * * *